(12) United States Patent
Sridhara et al.

(10) Patent No.: US 10,644,177 B2
(45) Date of Patent: May 5, 2020

(54) SOLAR CELL ASSEMBLY

(71) Applicant: REC SOLAR PTE. LTD., Singapore (SG)

(72) Inventors: Shankar Gauri Sridhara, Singapore (SG); Noel G. Diesta, Singapore (SG); Philipp Johannes Rostan, Singapore (SG); Robert Wade, Korntal (DE)

(73) Assignee: REC SOLAR PTE. LTD., Singapore (SG)

( * ) Notice: Subject to any disclaimer, the term of this patent is extended or adjusted under 35 U.S.C. 154(b) by 0 days.

(21) Appl. No.: 14/900,942

(22) PCT Filed: Jul. 2, 2014

(86) PCT No.: PCT/IB2014/001251
§ 371 (c)(1),
(2) Date: Dec. 22, 2015

(87) PCT Pub. No.: WO2015/001413
PCT Pub. Date: Jan. 8, 2015

(65) Prior Publication Data
US 2016/0141435 A1    May 19, 2016

(30) Foreign Application Priority Data
Jul. 5, 2013 (GB) .................................. 1312207.2

(51) Int. Cl.
*H01L 31/0443* (2014.01)
*H02S 40/34* (2014.01)
(Continued)

(52) U.S. Cl.
CPC ........ *H01L 31/0443* (2014.12); *H01L 31/044* (2014.12); *H01L 31/0504* (2013.01);
(Continued)

(58) Field of Classification Search
CPC ......................... H01L 31/0443; H01L 31/044
See application file for complete search history.

(56) References Cited

U.S. PATENT DOCUMENTS 9,130,401 B2    9/2015   Adest et al.
2009/0140719 A1    6/2009   Hasenfus
(Continued)

FOREIGN PATENT DOCUMENTS

CN    101304054 A    11/2008
CN    201478310        5/2010
(Continued)

OTHER PUBLICATIONS

"How to choose a bypass diode for a silicon panel junction box"; STMicroelectronics; XP55453067; Sep. 2011; pp. 1-24.
(Continued)

*Primary Examiner* — Shannon M Gardner
(74) *Attorney, Agent, or Firm* — Lee & Hayes, P.C.

(57) ABSTRACT

A solar cell assembly (200) is presented. The solar cell assembly includes one or more solar cell units (21 1) coupled in series. The solar cell unit includes a first solar cell series (221) and a second solar cell series (222) connected in parallel. The first and second solar cell series include a plurality of cells (202) connecting in series respectively. The solar cell assembly also includes a by-pass diode (201) coupled to each solar cell unit and shared between the first and second solar cell series in each solar cell unit.

13 Claims, 10 Drawing Sheets

(51) Int. Cl.
   *H02J 3/38*      (2006.01)
   *H01L 31/044*    (2014.01)
   *H01J 1/10*      (2006.01)
   *H01L 31/05*     (2014.01)
   *H02J 1/10*      (2006.01)

(52) U.S. Cl.
   CPC .............. *H02J 1/108* (2013.01); *H02J 3/383* (2013.01); *H02S 40/34* (2014.12); *Y02E 10/563* (2013.01)

(56) References Cited

U.S. PATENT DOCUMENTS

| | | | |
|---|---|---|---|
| 2010/0012172 A1 | 1/2010 | Meakin et al. | |
| 2011/0011439 A1 | 1/2011 | Hasegawa et al. | |
| 2011/0132431 A1 | 6/2011 | Linderman et al. | |
| 2011/0156883 A1 | 6/2011 | Balbo Di Vinadio et al. | |
| 2011/0273015 A1 | 11/2011 | Adest et al. | |
| 2011/0284052 A1 | 11/2011 | Croft et al. | |
| 2012/0274389 A1* | 11/2012 | Ger | H01L 31/044 327/504 |
| 2012/0318318 A1 | 12/2012 | Metin et al. | |
| 2012/0318319 A1 | 12/2012 | Pinarbasi et al. | |
| 2013/0098423 A1 | 4/2013 | Shimasaki et al. | |

FOREIGN PATENT DOCUMENTS

| | | |
|---|---|---|
| CN | 102111090 A | 6/2011 |
| CN | 202384370 U | 8/2012 |
| CN | 202423319 U | 9/2012 |
| CN | 102709372 | 10/2012 |
| CN | 102761290 A | 10/2012 |
| CN | 102820341 | 12/2012 |
| CN | 202585481 U | 12/2012 |
| CN | 102959723 | 3/2013 |
| CN | 202948942 U | 5/2013 |
| DE | 102009054039 A1 | 12/2010 |
| DE | 112010005717 | 6/2013 |
| DE | 10 2012 207 168 A1 | 10/2013 |
| EP | 2341717 A1 | 7/2011 |
| EP | 2 511 959 A1 | 10/2012 |
| EP | 2546947 A2 | 1/2013 |
| JP | H07302923 | 11/1995 |
| JP | H10256584 | 9/1998 |
| JP | 2001135847 | 5/2001 |
| JP | 2001339088 | 12/2001 |
| JP | 2003-078155 A | 3/2003 |
| JP | 2003-282916 A | 10/2003 |
| JP | 2006332353 | 12/2006 |
| WO | WO2005112133 | 3/2008 |
| WO | WO 2013/075144 A1 | 5/2013 |
| WO | WO2012001815 | 8/2013 |
| WO | WO2013105472 | 5/2015 |

OTHER PUBLICATIONS

Communication Pursuant to Article 94(3) EPC issued by the European Patent Office dated Jun. 21, 2019 in corresponding Application No. 14765996.5 (4 pages).
Combined Search and Examination Report from GB 1312207 2 dated Jan. 20, 2014.
Notification of Refusal from JP 2016-522888 dated Jan. 8, 2019.
Notification of Refusal from JP 2016-522888 dated Jun. 5, 2018.
Office Action and Translation from CN 201780038577 dated Jul. 27, 2017.
Office Action and Translation of Office Action from CN 201780038577 dated May 31, 2018.
Office Action from CA 2916582 dated Nov. 15, 2018.
Office Action from CA 2916582 dated Dec. 6, 2017.
Office Action from EP 14765996 dated Jun. 25, 2018.
Office Action from EP 14765996 dated Mar. 1, 2018.
Office Action from EP 14765996 dated Dec. 4, 2017.
Office Action from EP 14765996 dated Aug. 15, 2018.
Office Action from EP 14765996 dated Jun. 21, 2019.
Office Action from EP 14765996 dated Jan. 3, 2019.
Office Action from JP 2016-522888 dated Nov. 20, 2018.
Kumar, M and A. Kumar, "Performance Assessment and Degradation Analysis of solar Photovoltaic Technologies: A Review", Renewable and Sustainable Energy Reviews, Oct. 1, 2017, pp. 554-587.
Search from TW 103122989 completed Nov. 8, 2017.
Search Report from GB 1312207 2 dated Dec. 10, 2013.
Stauth, et al., A Distributed Photovolatic energy Optimization System Based on a Sub-Module Pesonant Switched-Capacitor Implementation, Power Electronics and Motion Control Conference 2012, Sep. 4, 2012.
Substantive Examination Report from MY PI 2015704616 dated Mar. 29, 2019.

* cited by examiner

100

SOLAR CELL ASSEMBLY

FIELD OF THE INVENTION

The present invention relates to solar cell assemblies and to solar cell modules including such solar cell assemblies.

TECHNICAL BACKGROUND

Solar cells are used to convert sunlight into electricity using a photovoltaic effect. As shown in FIG. 1a, solar cell modules 100 on the basis of crystalline silicon solar cells may typically include 6×10 solar cells 104 of dimensions 15.6×15.6 cm2 which may be arranged in six parallel interconnected solar cell strings. Each string may include ten or twelve mono- or multi-crystalline solar cells that are connected in series by copper ribbons 106. The strings in turn may be again connected in series by so-called cross-connectors 105 so that all cells in the module are connected in series. Solar cell modules with for example 4×9, 6×8 or 6×12 solar cells in the same type of configuration are also common.

Under normal operation conditions, all solar cells may be illuminated and operate at their maximum power point of about 0.5 V. The total module voltage thereby adds up to about 30 V for a solar cell module of 6×10 solar cells. Under certain circumstances, however, partial shading of the module can occur. When a solar cell is shaded, the generated electrical current decreases proportionally with the illumination level. Due to the series connection, the cell with the lowest current determines the overall current in the module. In a situation with only one cell being shaded, this would lead to a complete loss of power of the whole module.

To avoid such complete power loss, so-called by-pass diodes 101 may be incorporated into the module. The by-pass diodes are connected in parallel with a certain number of solar cells. In case of shading, only the cells that are in parallel with the same by-pass diode as the shaded cell may be affected by the power loss. The number of by-pass diodes per module is a compromise between the number of cells that should be affected by partial shading and the cost for incorporating the by-pass diodes. Typically, two strings including 20 cells maximum are connected to one by-pass diode. The by-pass diodes may be located in a junction box 102 that serves as a fixture for the cables used to connect the module to neighboring modules. FIG. 1b shows the electrical schematics of a typical module 100 with three by-pass diodes 101 that are mounted in the junction box 102. The strings are connected to the junction box by the cross-connectors 103 and are connected in series with each other by the cross-connectors 105 on the opposite side.

In a partial-shading situation, where only one cell 104 is completely shaded, the by-pass diode short-circuits all cells that are connected in parallel to the diode. In that situation, the illuminated cells still operate between their maximum power point and their open-circuit voltage at about 0.5-0.6 V each, whereas the shaded cell does not generate any voltage. In contrast, the combined voltage of the illuminated cells of 19 times about 0.5-0.6 V leads to a voltage of up to about 11.4 V being applied to the shaded cell in reverse bias direction.

Due to the diode-characteristic of the solar cells, there is only a negligible reverse saturation current flowing when a reverse bias voltage is applied. However, the solar cell can only withstand a certain maximum reverse bias before it comes to avalanche breakdown of the diode which may lead to rapid heat generation and ultimately to the destruction of the solar cell. Even before destruction, local shunts or "hot-spots" may lead to increased heat generation that can damage the module encapsulation and even cause fire.

Therefore, the maximum applied reverse bias voltage should not exceed the breakdown voltage of typically about 13 V. The exact breakdown voltage depends on the wafer material and the cell design of the solar cells. At given open-circuit voltages of the solar cells, the breakdown voltage limits the number of cells that can be connected to one by-pass diode.

The numbers above show that in the conventional module layout with cross-connectors and junction box at the narrow side of the module, the number of cells per by-pass diode is already close to the maximum.

An approach to increase module output power is to reduce the length of the solar cells in the direction of their interconnection with the ribbons 106, typically achieved by cutting the cells in half. By doing so, resistive losses, which show a parabolic dependence on the length of the cells, can effectively be reduced. Power output can be improved by around 2% with such an approach. However, the number of cells in each string doubles and so does the number of cells per by-pass diode.

Another approach may be using half-cut cells and using one by-pass diode for each string, ie, by incorporating a connector ribbon to connect the one end of the string with the junction box on the opposite side. The drawback of this solution is the power loss of approximately 0.5% in the connector ribbon and the substantial additional cost for the ribbon as well as the necessity to provide multiple back sheet layers where the ribbons are located to avoid shunting.

Therefore, there is a desire to have an optimal cell configuration in solar cell modules such that the maximum reverse breakdown voltages are not exceeded and such that the use of connector ribbons of excessive lengths is avoided.

SUMMARY OF THE INVENTION

A solar cell assembly is presented. The solar cell assembly includes one or more solar cell units coupled in series. The solar cell unit includes a first solar cell series and a second solar cell series connected in parallel. The first and second solar cell series include a plurality of solar cells connecting in series respectively. The solar cell assembly also includes a by-pass diode coupled to each solar cell unit, wherein the by-pass diode is coupled in parallel with the first solar cell series and second solar cell series respectively, i.e. the by-pass diode may be interpreted as being shared between the first and second solar cell series in each solar cell unit.

Objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, the same reference characters generally refer to same or similar parts throughout the different views. Also, the drawings are only schematically and not necessarily to scale, emphasis instead generally being placed upon illustrating the principles of the invention. In the following description, various embodiments are described with reference to the following drawings, in which.

DESCRIPTION OF PREFERRED EMBODIMENTS

Embodiments generally relate to devices, for example, devices for converting energy of light into electrical energy. More particularly, the devices may be solar cell elements or solar cell modules including a plurality of solar cell elements.

Figure 1A:
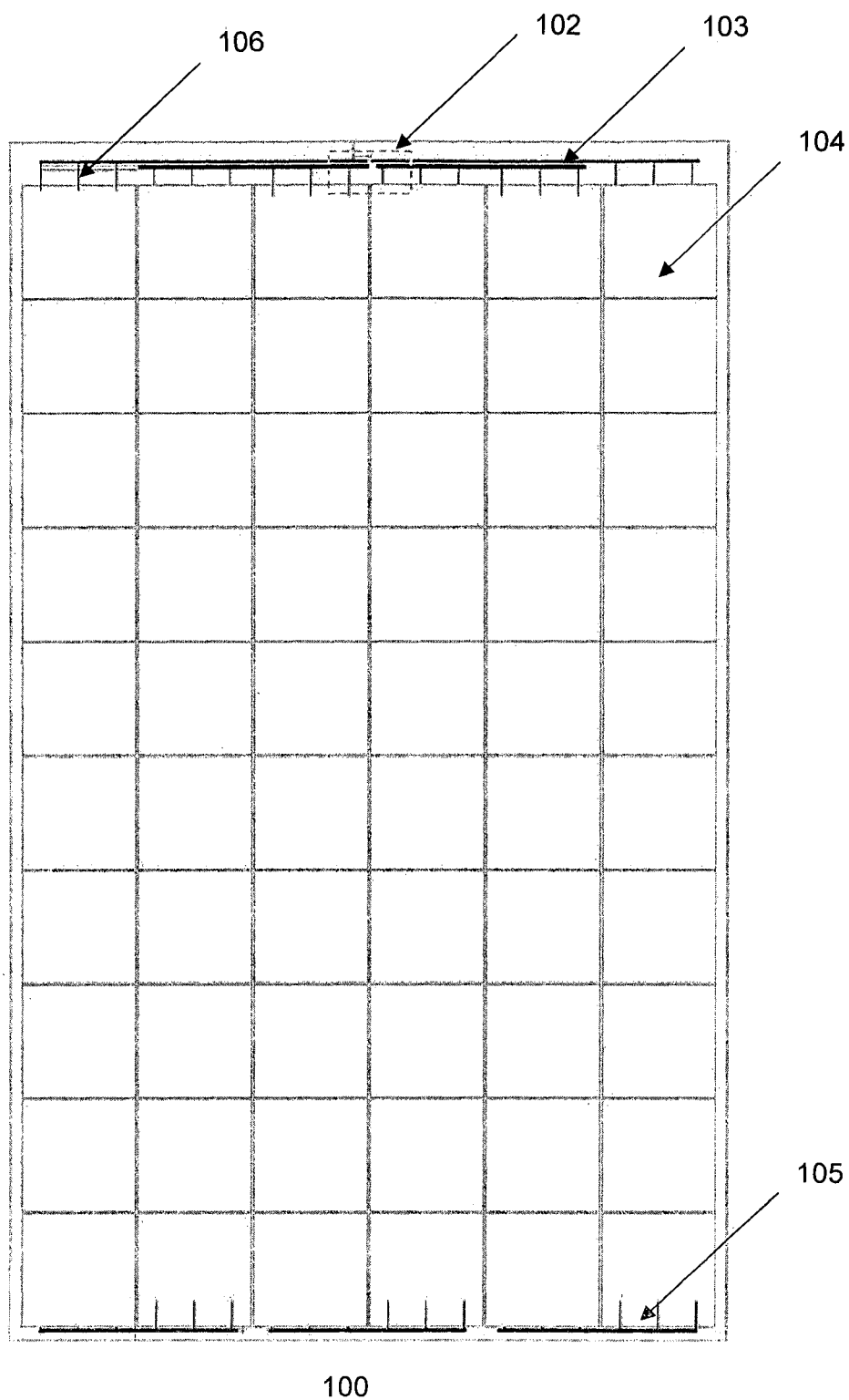
FIGS. 1a-b show a layout of a solar cell module.
Figure 1B:
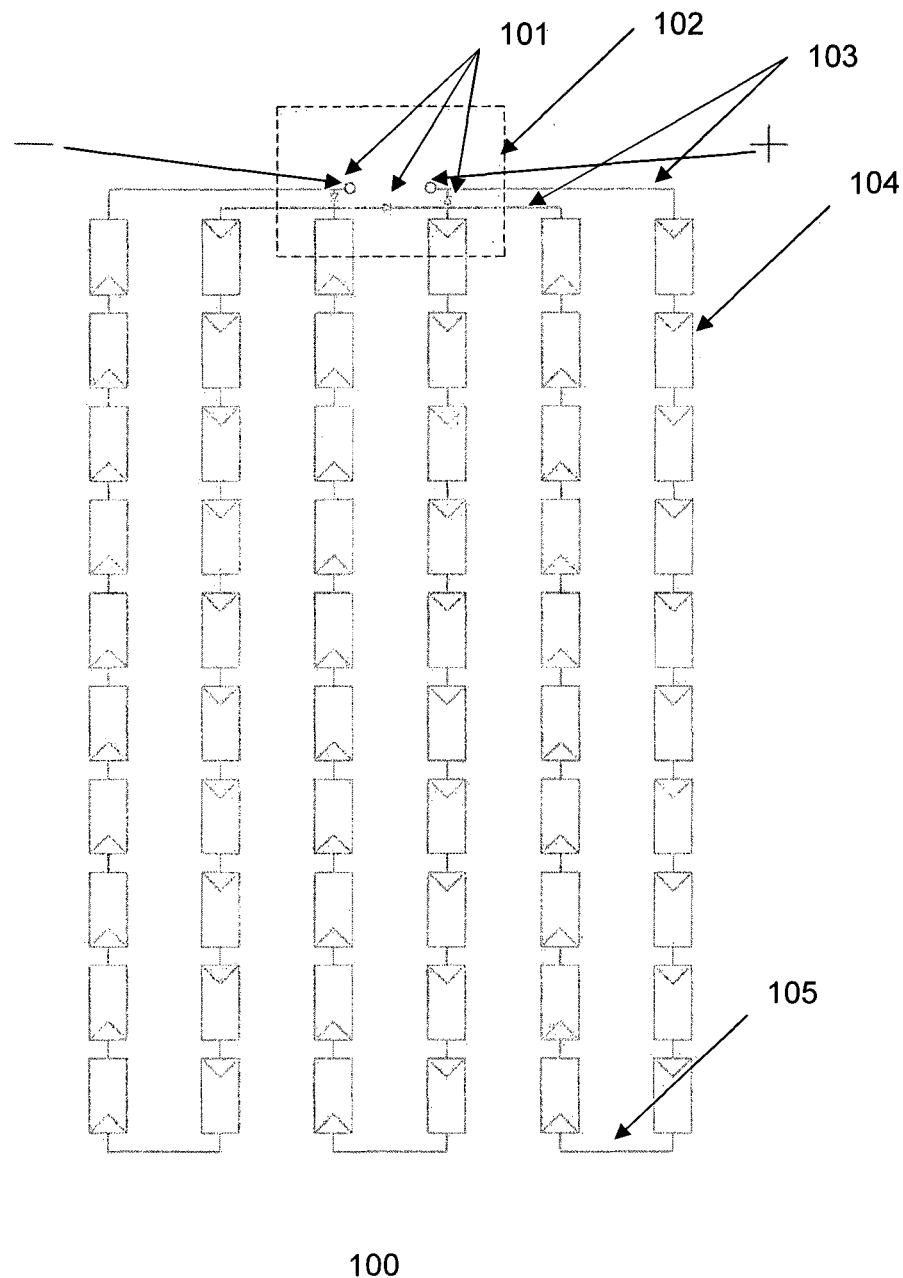
Figure 2A:
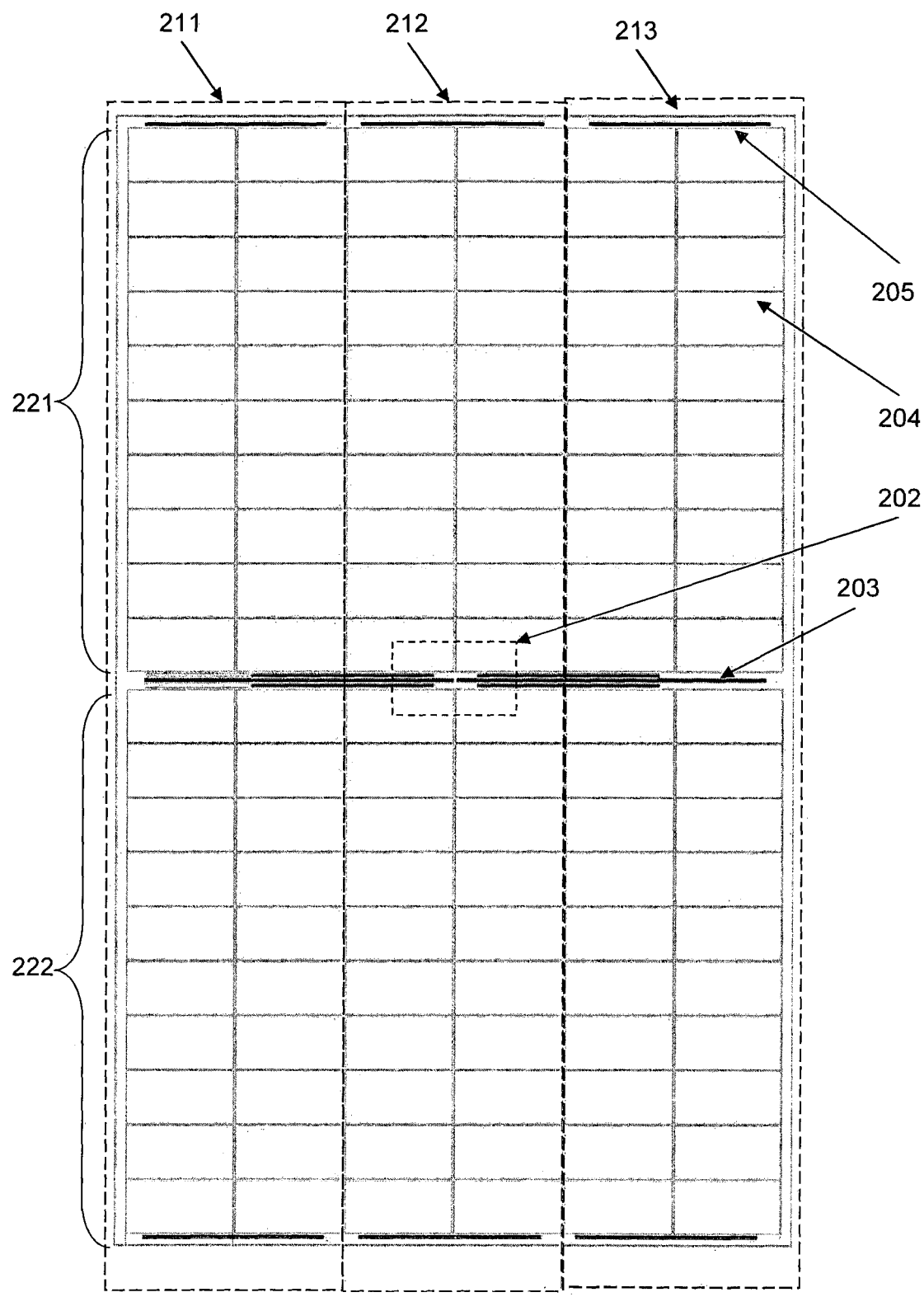
FIGS. 2a-b show an embodiment of a solar cell assembly layout and a corresponding electrical schematic diagram.
Figure 2B:
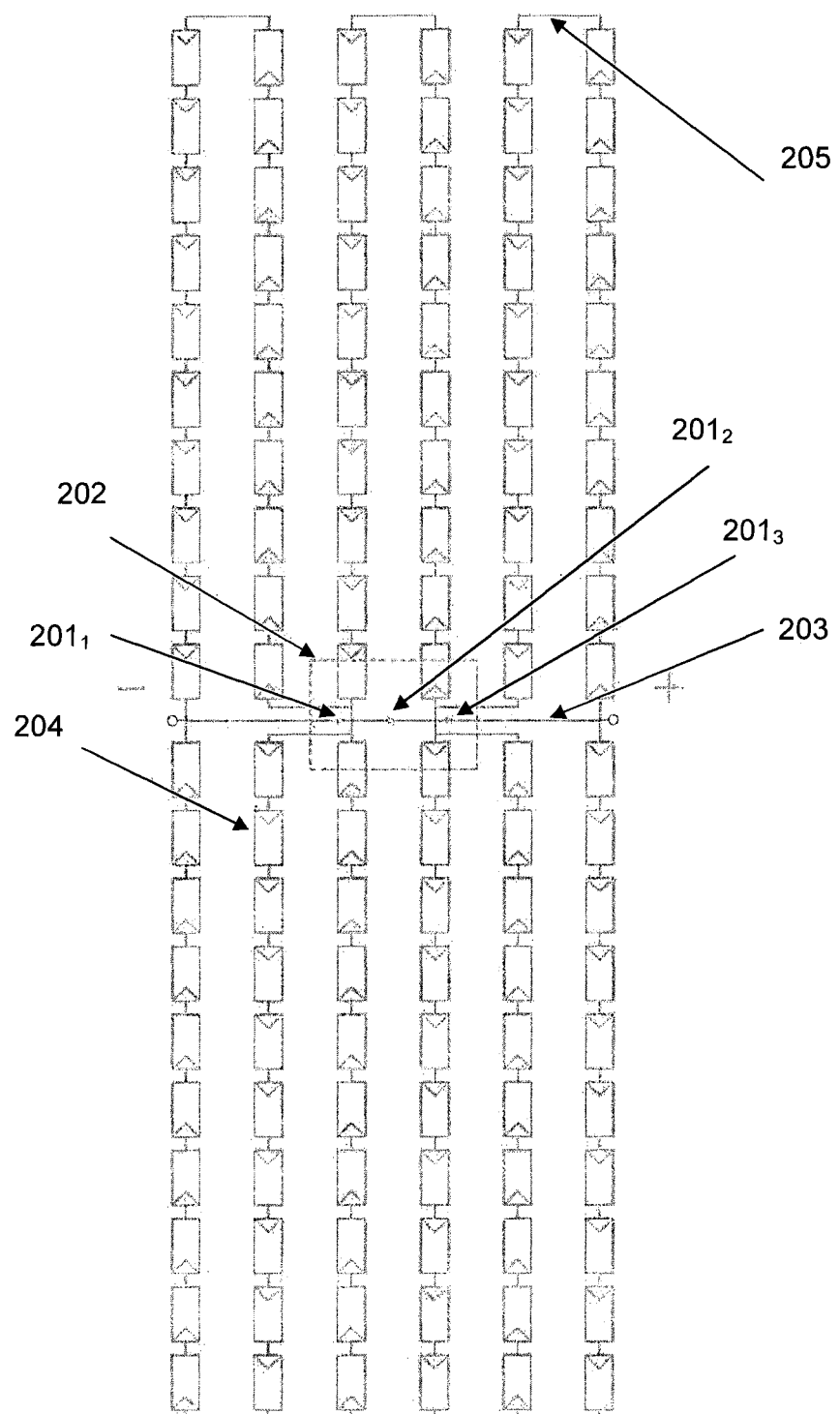

FIG. 2a shows an embodiment of a solar cell assembly layout 200 and FIG. 2b shows a corresponding electrical schematic diagram. In one embodiment, the solar cell assembly is a solar cell module. In another embodiment, the solar cell assembly is a portion of a solar cell module. The solar cell assembly may include solar cells 204 which may be arranged in one or more solar cell units. As illustrated in FIG. 2a, the solar cell assembly 200 includes three solar cell units, for example, a first solar cell unit 211, a second solar cell unit 212 and a third solar cell unit 213. Having solar cell assemblies including another number of solar cell units may also be useful.

In one embodiment, a solar cell unit includes a first solar cell series and a second solar cell series. For example, the first solar cell unit 211 may include a first solar cell series 221 and a second solar cell series 222. Within each of the solar cell series, a plurality of solar cells may be connected in series. For example, for a solar cell assembly in the form of a 6×10 solar cell module, the first solar cell series may include 10 solar cells with 15.6×15.6 cm2 dimensions. The solar cell series may also include other numbers of solar cells, for example, 12 solar cells with 15.6×15.6 cm2 dimensions for a 6×12 solar cell module may also be useful. In another embodiment, the solar cell unit includes solar cells cut into a plurality of sections. For example, as shown in FIG. 2a, the solar cells are cut into half and connected in series with each other within each solar cell series. By cutting the solar cells into half, resistive losses, which show a parabolic dependence on the length of the cells, may effectively be reduced. Power output may be improved by about 2%.

In one embodiment, the first and second solar cell series within the same solar cell unit share a same by-pass diode. The by-pass diode may include a semiconductor material, such as silicon, with two terminals attached. The by-pass diode may be used to circumvent destructive effects of hot-spot heating. In one embodiment, the bypass diode is connected in parallel, but with opposite polarity, to a solar cell or a group of solar cells connected in series. Under normal operation, each solar cell in the group may be forward biased and the bypass diode may be reverse biased. However, when a portion of the solar cell group is shaded, the bypass diode may become forward biased and allow the current produced by the unshaded portion to flow through the by-pass diode, thus avoiding the high resistance of the shaded portion and preventing hot-spot heating.

For example, the first and second solar cell series 221 and 222 within the first solar cell unit may share a first by-pass diode 2011. In one embodiment, the first solar cell series is connected in parallel with the second solar cell series which may have substantially the same open circuit voltage, Voc, as the first solar cell series. More particularly, the first and second solar cell series may be mirror images of each other with respect to the first by-pass diode. Other configurations of the first and second solar cell series within one solar cell unit which achieve the same Voc may also be useful. In one embodiment, the first by-pass diode, first solar cell series and second solar cell series are coupled to each other in parallel. In one embodiment, the cathode of the first by-pass diode may be connected to the positive nodes of both the first and second solar cell series, and the anode of the first by-pass diode may be connected to the negative nodes of both the first and second solar cell series. The configurations of the first and second solar cell series and by-pass diodes within other solar cell units may be similar to that within the first solar cell unit.

In one embodiment, the solar cell series are connected with the by-pass diodes via cross-connectors 203. The cross-connectors may be made of conductive materials. such as metals, comprising e.g. copper, aluminum, silver or alloys thereof. For example, the cross-connectors may be copper ribbons. Other types of conductive materials may also be used for the cross-connectors.

In one embodiment, the solar cells in a solar cell series are arranged in one or more strings connected in series. For example, for a solar cell assembly having 6×10 solar cells of 15.6×15.6 cm2 dimensions, the first solar cell series in the first solar cell unit may include two strings with each string containing 5 solar cells connected in series. Strings with other numbers of solar cells with other dimensions may also be useful. For example, as shown in FIG. 2a, for a solar cell assembly having 6×20 half-cut solar cells of 15.6×7.8 cm2 dimensions, the first solar cell series in the first solar cell unit may include two strings with each string containing 10 half-cut solar cells connected in series. The two strings within the first solar cell series may be connected in series by cross-connectors 205.

The other solar cell units within the solar cell assembly may have similar configurations of solar cells as that in the first solar cell unit. In one embodiment, the solar cell units are connected to each other in series, provided that they generate substantially the same output current as each other. In one embodiment, the cross-connectors 203 of some or all the solar cell units within the assembly are combined as one central cross-connector assembly and placed substantially in the centre line of the solar cell assembly/module as shown in FIG. 2a. Due to the symmetry of the solar cell assembly, it may not make a difference for the electrical device structure. Therefore, only a small amount of additional cross-connectors is required when compared to the conventional solar cell assembly/module layout, and the additional area required for the cross-connectors 203 and 205 is kept to a minimum. It may be important not to increase the area of the module during production, so that the same equipment may be used for producing conventional modules. In addition, module efficiency may not be sacrificed, which is the module power normalized to the module area and the standard irradiated power.

When all solar cells, for example, in the first solar cell unit 211, operate normally and provide enough current to a load, the first by-pass diode 2011 coupled to the first solar cell unit 211 may be reverse biased, and all cells in the first solar cell unit operate close to a maximum power point (MPP).

However, when a portion of the first solar cell unit becomes incapable of generating enough current for the load, for example, when the portion of the first solar cell series is shaded from the sun or even damaged, the shaded or damaged portion may become reverse biased and the first by-pass diode 2011 coupled in parallel may become forward biased to conduct currents. The shaded or damaged first solar cell series may not contribute to the power output of the assembly, while the second solar cell series which are not shaded or damaged may still contribute to the power output of the assembly to a small extent. This embodiment may have better performance than the conventional configurations of the solar cell modules in which all solar cells connected parallel to the by-pass diode contribute no power when the by-pass diode is forward biased.

For example, for a solar cell assembly including 6×20 solar half-cut solar cells, 10 half-cut solar cells are connected in series in one string as shown in FIG. 2a. As the solar cell assembly is divided into three solar cell units with one by-pass diode coupled with one solar cell unit, this configuration allows 40 solar cells per by-pass diode without the maximum applied reverse bias voltage exceeding the breakdown voltage. "Hot-spots" or destruction of solar cells may therefore be reduced.

Figure 5:
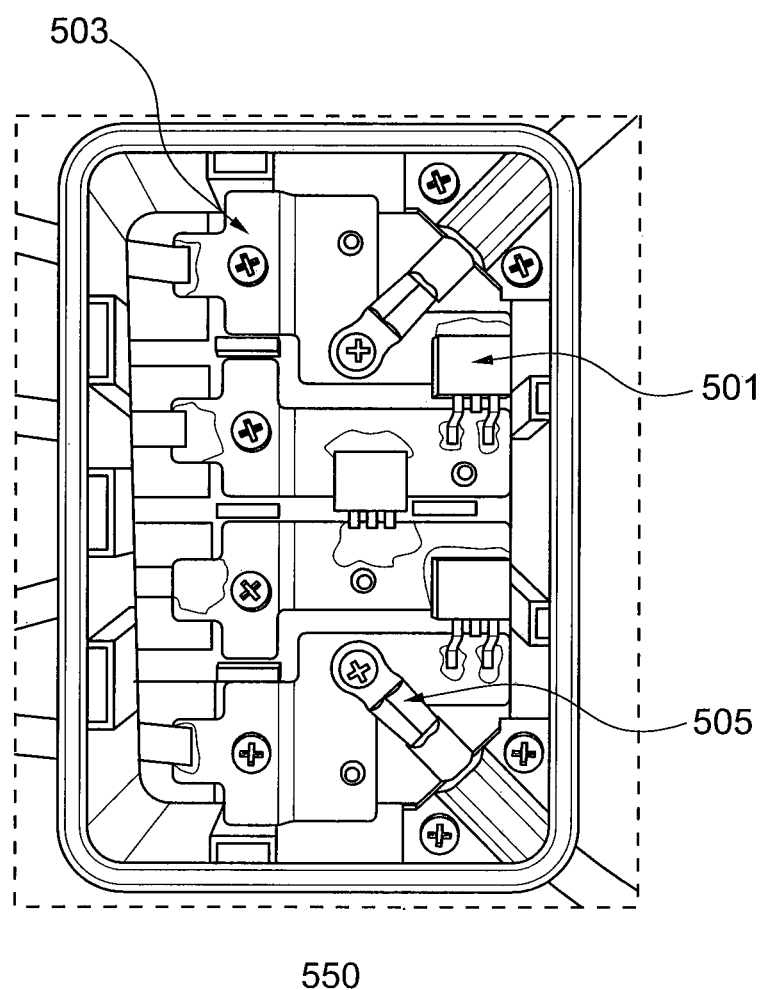
FIG. 5 shows an embodiment of a junction box.

In one embodiment, the by-pass diodes are housed in one or more junction boxes. FIG. 5 shows an embodiment of a junction box 550. The junction box may include at least one by-pass diode 501. The junction box may also include input terminal 503 for electrically coupling to respective solar cell strings and output terminal 505 for coupling to an external device, for example, a power conditioner. In one embodiment, the junction box collects electrical power from both solar cell series within some or all solar cell units and outputs the power to the external device.

In one embodiment, as shown in FIG. 2a, all by-pass diodes in the solar cell assembly are mounted in a single junction box. In another embodiment, a plurality of junction boxes are used with each junction box containing a subset of the by-pass diodes coupled with the solar cell units. For example, equal number of junction boxes as the by-pass diodes may be used with each junction box housing one by-pass diode. As an illustration, three junction boxes may be used to house the three by-pass diodes with each junction box containing one by-pass diode. Other numbers of junction boxes may also be used. For example, two junction boxes may be used with a first junction box housing two by-pass diodes and a second junction box housing one by-pass diode.

In one embodiment, the junction boxes are placed on the rear side of the solar cell assembly. The junction boxes may be disposed substantially in the centre line of the rear side of the solar cell assembly. For example, for a solar cell assembly/module including a single junction box housing all by-pass diodes therein, the junction box may be placed substantially in the middle of the rear side of the solar cell assembly/module. For a solar cell assembly/module including a plurality of junction boxes, the junction boxes may be placed substantially in the centre line of the rear side of the solar cell assembly and substantially equidistant from each other or edges of the assembly/module. Other placements of the junction boxes which minimize the amount of cross-connectors may also be useful.

In yet another embodiment, a subset or all by-pass diodes in the solar cell assembly include integrated by-pass diodes which are integrated in a laminate of the solar cell assembly/module instead of being housed in junction boxes. In one embodiment, a combination of junction boxes and integrated by-pass diodes are used. For example, for a solar cell assembly including three by-pass diodes, a combination of junction boxes and integrated by-pass diodes may be used. More particularly, a second by-pass diode may be an integrated by-pass diode integrated in the laminate of the solar cell assembly/module, while first and third by-pass diodes may be housed in junction boxes together with cross-connectors connecting to external devices or other assemblies/modules. The second by-pass diode may be placed substantially in the middle of the assembly/module while the first and third by-pass diodes may be placed near the edges of the assembly/module.

Figure 6A:
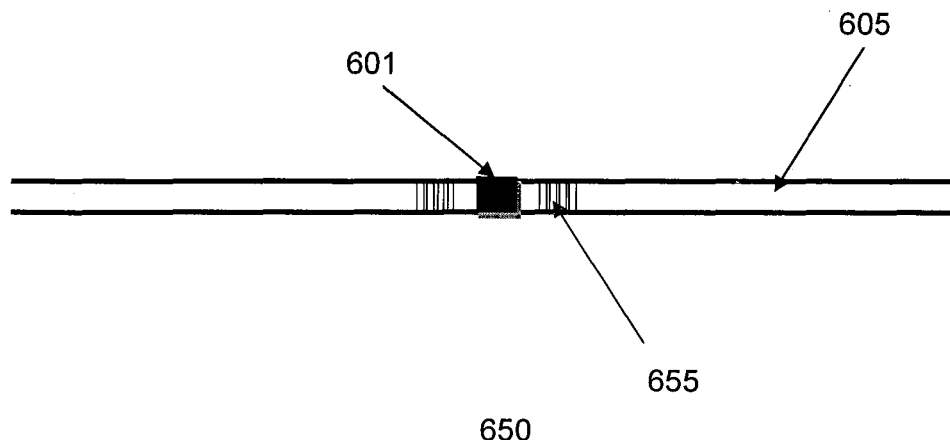
FIGS. 6a-b show an embodiment of a by-pass diode.
Figure 6B:
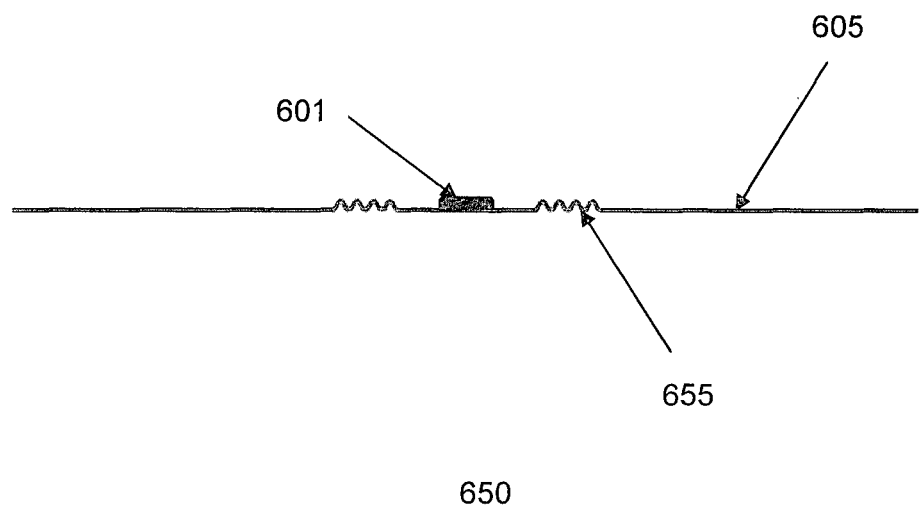

FIGS. 6a-b show an embodiment of an integrated by-pass diode unit 650 for being integrated in the laminate. In one embodiment, the integrated by-pass diode unit includes an integrated by-pass diode 601 and two cross-connectors 605 for coupling to adjacent by-pass diodes or external terminals. The cross-connectors may include corrugation structures 655 as a stress relief to prevent the integrated by-pass diode and a mechanical connection between the integrated by-pass diode and the cross-connectors from cracking due to electrical or mechanical overstresses. Other structures for stress relief purposes may also be incorporated in the integrated by-pass diode unit.

Figure 3A:
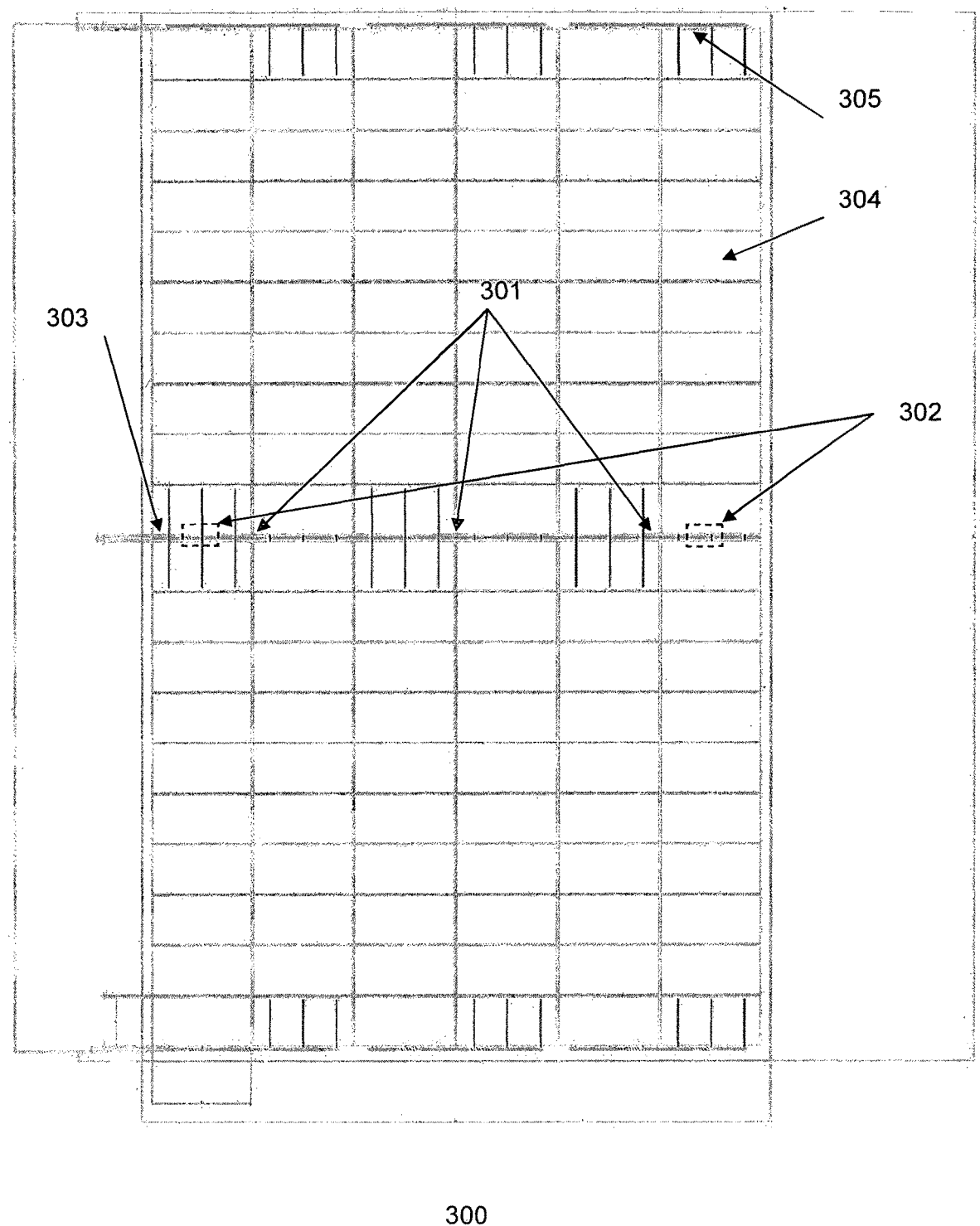
FIGS. 3a-b show another embodiment of a solar cell assembly layout and a corresponding electrical schematic diagram.
Figure 3B:
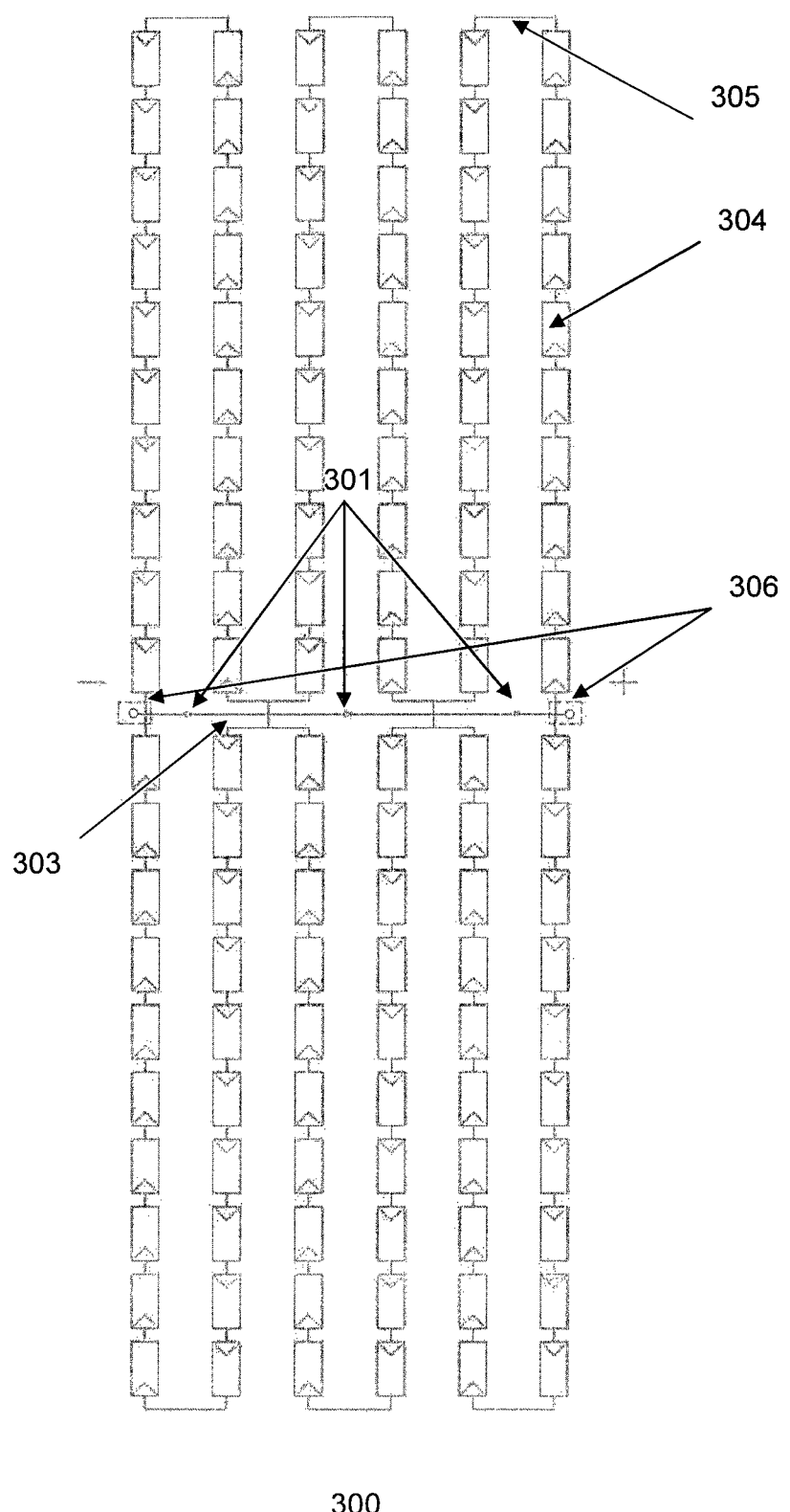

It may be possible that all by-pass diodes in the solar cell assembly are integrated by-pass diodes as shown in FIGS. 3a-b. FIG. 3a shows another embodiment of the solar cell assembly layout 300 and FIG. 3b shows the corresponding electrical schematic diagram. Features in this embodiment which are similar to that described in FIGS. 2a-b will not be described or described in detail. The solar cell assembly ma include solar cells 304 which ma be arranged in one or more solar cell units. In this embodiment, all by-pass diodes 301 coupled to the solar cell units include integrated by-pass diodes which are integrated into the laminate of the solar assembly/module. In such a case, two integrated by-pass diodes near edges of the module may be connected to two external terminals 302 respectively to connect to an external device or other assemblies/modules. The two external terminals may be disposed in two terminal boxes.

This approach may have the advantage of reducing the length of the cross-connectors 303, 305 and thereby reducing the electrical losses in the cross-connectors 303, which leads to an increased module power output. On top of the higher power output, the module area may also be reduced which leads to an additional increase in module efficiency. Because the approach requires smaller amount of cross-connectors 303, cheaper connector terminals and less potting material, it may effectively reduce the module production cost. Since the connector terminals and cables may be located near the edges of the module, connecting the modules in a photovoltaic array may be facilitated. The cables may be shorter compared to the solution with mounted junction boxes shown in FIG. 2a. This may result in reduced resistive losses in the cables, reduced cost and easier handling during installation of the modules. Instead of cable connectors, it may also be possible to integrate connector plugs into the sides of the module frames to reduce the resistive losses further.

Figure 4A:
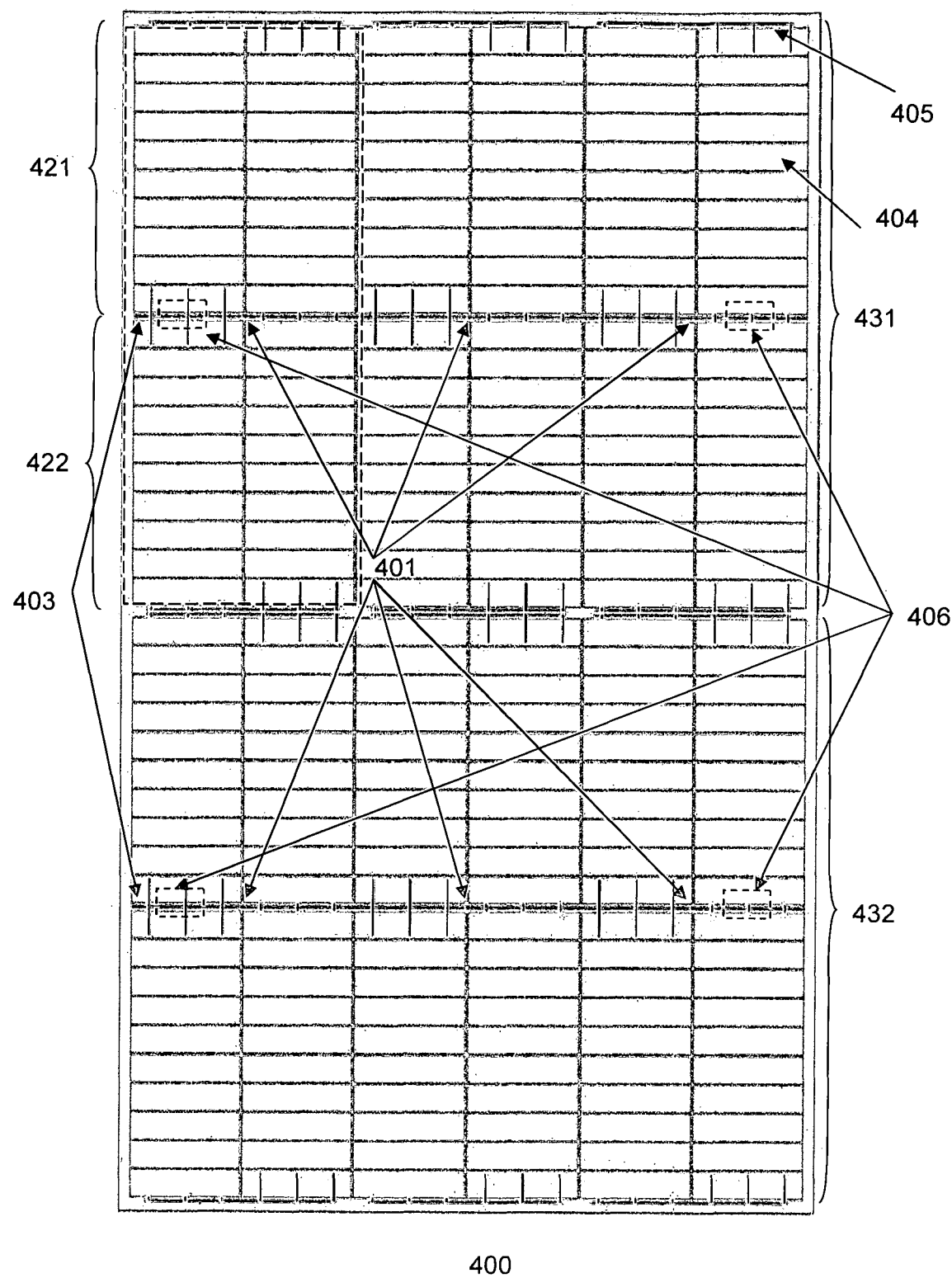
FIGS. 4a-b show yet another embodiment of a solar cell assembly layout and a corresponding electrical schematic diagram.
Figure 4B:
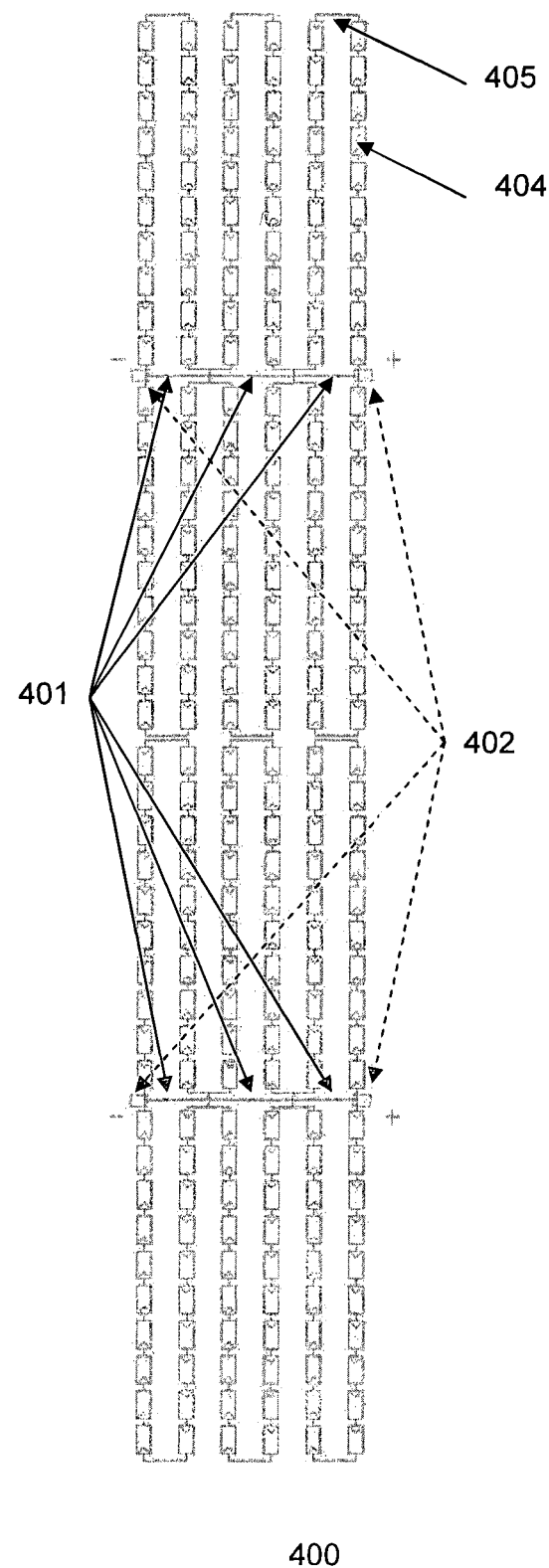

FIG. 4a shows an embodiment of the solar cell module 400 and FIG. 4b shows the corresponding electrical schematic diagram. Features in this embodiment which are similar to that described in FIGS. 3a-b will not be described or described in detail. In one embodiment, the solar cell module includes a first solar cell assembly 431 and a second solar cell assembly 432. The first solar cell assembly 431 includes solar cells 404 of 15.6×3.9 cm2 dimensions. The solar cells 404 may be obtained by cutting solar cells of 15.6×15.6 cm2 dimensions into quarters. The first solar cell assembly may include one or more solar cell units 412 having a first solar cell series 421 and a second solar cell series 422. Within the solar cell series, a plurality of solar cells may be connected in series. For example, for a solar cell assembly with 6×20 solar cells of 15.6×3.9 cm2 dimensions, the first solar cell series may include 20 such solar cells. The first solar cell series may also include other numbers of solar cells, for example, 24 solar cells with 15.6×3.9 cm2 dimensions for a solar cell assembly with 6×24 solar cells of 15.6×3.9 cm2 dimensions. The configurations of the solar cell units may be similar to those described in FIGS. 2a-b and FIGS. 3a-b. For example, the first and second solar cell series with substantially the same Voc may be connected in parallel and share a first by-pass diode 401. More particularly, the first and second solar cell series may be mirror images of each other with respect to the first by-pass diode 401. In one embodiment, the solar cell series are connected with the first by-pass diodes via cross-connectors 403. The cross-connectors 403 of some or all the solar cell units within the first solar cell assembly may be combined as one central cross-connector assembly and placed substantially in the centre line of the first solar cell assembly. In one embodiment, connector terminals 406 are used to couple to the cross-connectors or central cross-connector assembly.

The configurations of the by-pass diodes and cross-connectors 405 included in the solar cell assemblies in FIGS. 4a-b may be similar to those described in FIGS. 2a-b and FIGS. 3a-b In one embodiment, two solar cell assemblies are included in one solar cell module as illustrated in FIGS. 4a-b. Other numbers of solar cell assemblies may also be included in the solar cell module depending on the requirements and configurations of the solar cells and modules. The solar cell assemblies within one solar cell module may be connected to each other by one connector that connects the first ends and a second connector that connects the second ends of the solar cell assemblies. This is a design that may be more tolerant to shading than conventional designs of solar cell modules.

The invention may be embodied in other specific forms without departing from the scope of the invention. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

Terms such as "about" in conjunction with a specific distance or size are to be interpreted as not to exclude insignificant deviation from the specified distance or size and may include for example deviations of up to 20%. Furthermore, terms such as "substantially parallel" or "substantially perpendicular" are to be interpreted as not to exclude insignificant deviation from the specified arrangement and may include for example deviations of up to 20°.

Finally, it should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

The invention claimed is:

1. A solar cell assembly comprising:
  a first solar cell unit, comprising:
    a first solar cell series including a plurality of half-cut solar cells connected in series;
    a second solar cell series, coupled in parallel with the first solar cell series, including a plurality of half-cut solar cells connected in series;
    a first bypass diode coupled in parallel with the first solar cell series and the second solar cell series; and
    a first junction box containing the first bypass diode; and
  a second solar cell unit, coupled in series with the first solar cell unit, comprising:
    a third solar cell series including a plurality of half-cut solar cells connected in series:
    a fourth solar cell series, coupled in parallel with the third solar cell series, including a plurality of half-cut solar cells connected in series;
    a second bypass diode coupled in parallel with the third solar cell series and the fourth solar cell series; and
    a second junction box containing the second bypass diode.

2. The solar cell assembly of claim 1 wherein the first solar cell series has substantially the same open circuit voltage, Voc, as the second solar cell series in the solar cell unit.

3. The solar cell assembly of claim 1, wherein the first and second solar cell series are mirror images of each other with respect to the bypass diode of the first solar cell unit, and the third and fourth solar cell series are mirror images of each other with respect to the bypass diode of the second solar cell unit.

4. The solar cell assembly of claim 1, wherein the first and second solar cell series are coupled with the bypass diode of the first solar cell unit via a first cross-connector, and the third and fourth solar cell series are coupled with the bypass diode of the second solar cell unit via a second cross-connector.

5. The solar cell assembly of claim 4, further comprising a central cross-connector assembly combining the first cross-connector and the second cross-connector as a single assembly.

6. The solar cell assembly of claim 5 wherein the central cross-connector assembly is placed substantially in a centre line of the solar cell assembly.

7. The solar cell assembly in of claim 1, further comprising a third solar cell unit including:
  a fifth solar cell series including a plurality of half-cut solar cells connected in series;
  a sixth solar cell series, coupled in parallel with the fifth solar cell series, including a plurality of half-cut solar cells connected in series; and
  an integrated bypass diode integrated in a laminate of the solar cell assembly, the integrated bypass diode being outside the first and second junction boxes and coupling the fifth solar cell series and the sixth solar cell series in parallel.

8. The solar cell assembly of claim 7, wherein the first and second junction boxes are located substantially near an edge of the solar cell assembly, and the integrated bypass diode is located substantially at a centerline of the solar cell assembly.

9. The solar cell assembly of claim 7, wherein the integrated bypass diode is coupled to the fifth and sixth solar cell series via a a cross-connector.

10. The solar cell assembly of claim 9, wherein the cross-connector comprises a corrugation structure for stress relief to prevent the integrated bypass diode and a mechanical connection between the integrated bypass diode and the cross-connector from cracking due to electrical or mechanical overstresses.

11. The solar cell assembly of claim 1, wherein the first and second junction boxes are placed substantially in a centerline of the solar cell assembly.

12. The solar cell assembly of claim 7, further comprising external terminals for coupling to output cross-connectors of the integrated bypass diode, the external terminals and the integrated bypass diode being placed near an edge of the solar cell assembly.

13. The solar cell assembly of claim 1, wherein the first solar cell series and the second solar cell series are coupled in parallel with the first bypass diode a via first cross-connector, the third solar cell series and the fourth solar cell series are coupled in parallel with the second by pass diode via a second cross-connector, and the first and second cross-connectors are combined as one central cross-connector assembly placed substantially in a centerline of the solar cell assembly.

* * * * *